United States Patent [19]

Westbrook et al.

[11] Patent Number: 5,278,727
[45] Date of Patent: Jan. 11, 1994

[54] HIGH DENSITY ELECTRICAL INTERCONNECTION DEVICE AND METHOD THEREFOR

[75] Inventors: Scott M. Westbrook, Los Altos; Gelston Howell, Campbell, both of Calif.

[73] Assignee: Digital Equipment Corporation, Maynard, Mass.

[21] Appl. No.: 859,288

[22] Filed: Mar. 25, 1992

Related U.S. Application Data

[63] Continuation of Ser. No. 528,880, May 29, 1990.

[51] Int. Cl.$^5$ .................. H05K 1/03; H05K 1/11
[52] U.S. Cl. .................. 361/792; 174/255; 174/257; 174/260; 361/386; 361/397; 361/416; 361/417; 361/718; 361/748; 361/805; 361/807; 439/48
[58] Field of Search .............. 174/251, 252, 255, 260, 174/261, 257; 361/386, 388, 389, 397, 400, 401, 410, 414, 416, 417, 419; 439/48

[56] References Cited

U.S. PATENT DOCUMENTS

| | | | |
|---|---|---|---|
| 3,398,232 | 8/1968 | Hoffman | 361/397 |
| 4,496,793 | 1/1985 | Hanson et al. | 174/255 |
| 4,654,248 | 3/1987 | Mohammed | 174/252 |
| 4,899,439 | 2/1990 | Potter et al. | 361/414 |
| 4,956,749 | 9/1990 | Chang | 361/414 |
| 4,959,900 | 10/1990 | de Givry et al. | 361/388 |

FOREIGN PATENT DOCUMENTS 0052738  6/1982  European Pat. Off. ............ 361/397

OTHER PUBLICATIONS

IBM Technical Disclosure Bulletin by Dougherty vol. 19 No. 8 Jan. 1977.

*Primary Examiner*—Leo P. Picard
*Assistant Examiner*—Donald A. Sparks

[57] ABSTRACT

A high density electrical interconnection device provides a uniform complementary pattern of thieving lines on both X and Y interconnect layers of the high density device to provide for uniform plating of the copper conductors, as well as reducing both nonuniformity and the amount of contraction and expansion of the insulating substrate. The complementary line pattern of thieving lines is generated by computer-aided design techniques and also includes provisions for gaps in thieving lines in one layer so as to eliminate crossover coupling with another layer and provides for visual identification of the thieving lines by the use of an undulating pattern.

5 Claims, 7 Drawing Sheets

FIG.−1
(PRIOR ART)

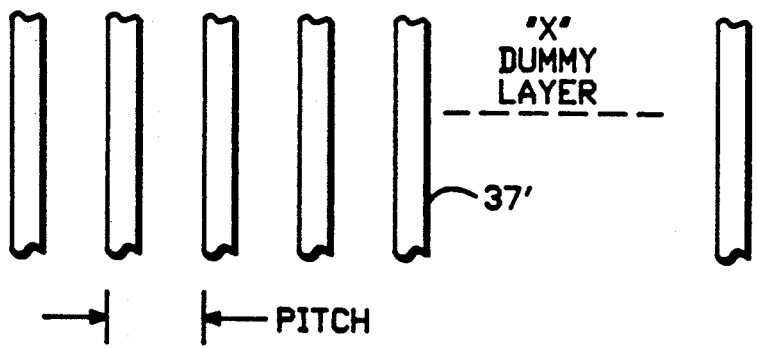
FIG.—6A
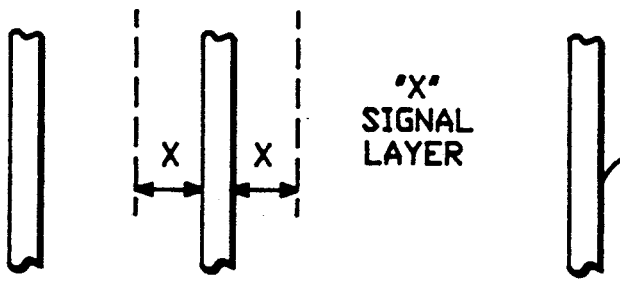
FIG.—6B
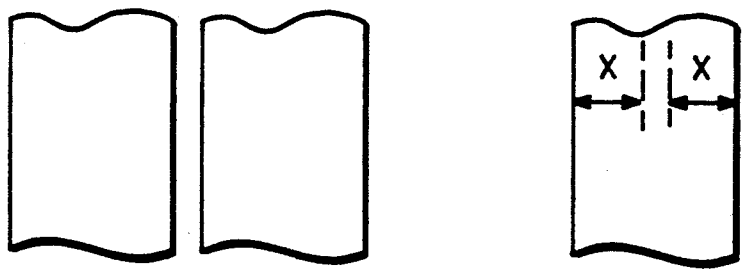
FIG.—6C
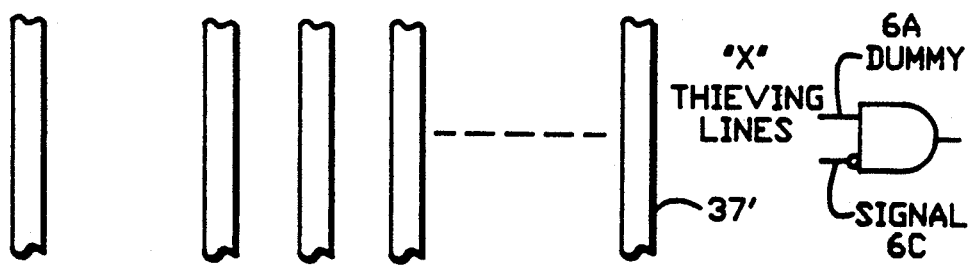
FIG.—6D
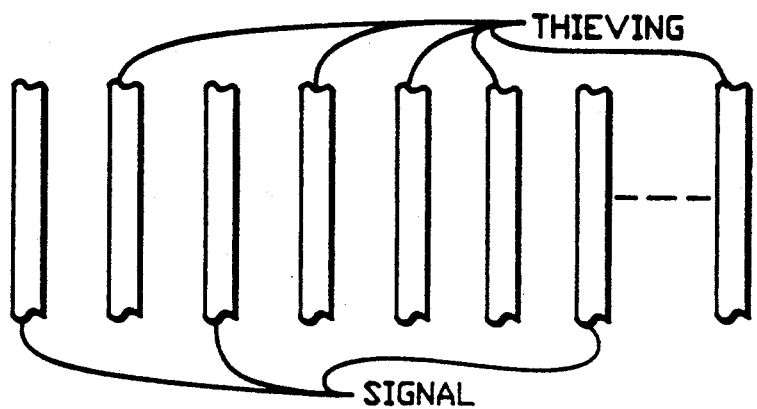
FIG.—6E

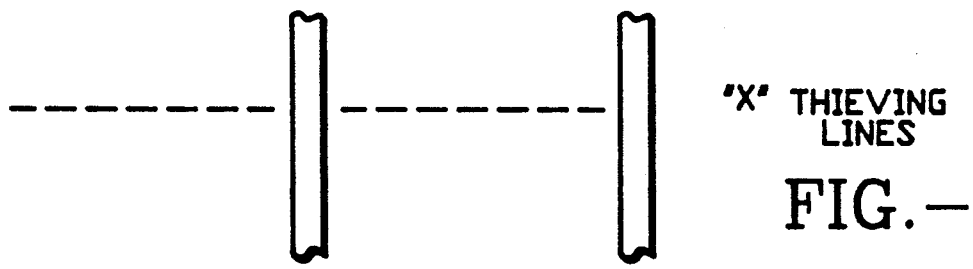
"X" THIEVING LINES
FIG.—6D'
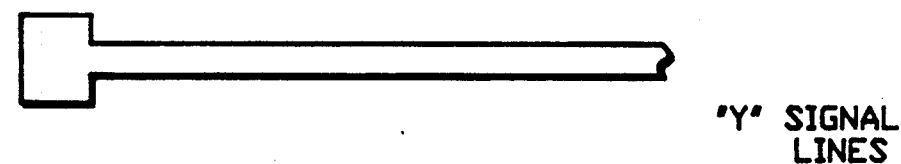
"Y" SIGNAL LINES
FIG.—6F
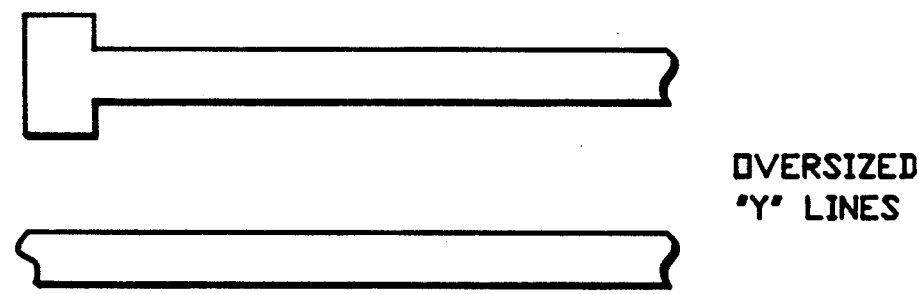
OVERSIZED "Y" LINES
FIG.—6G
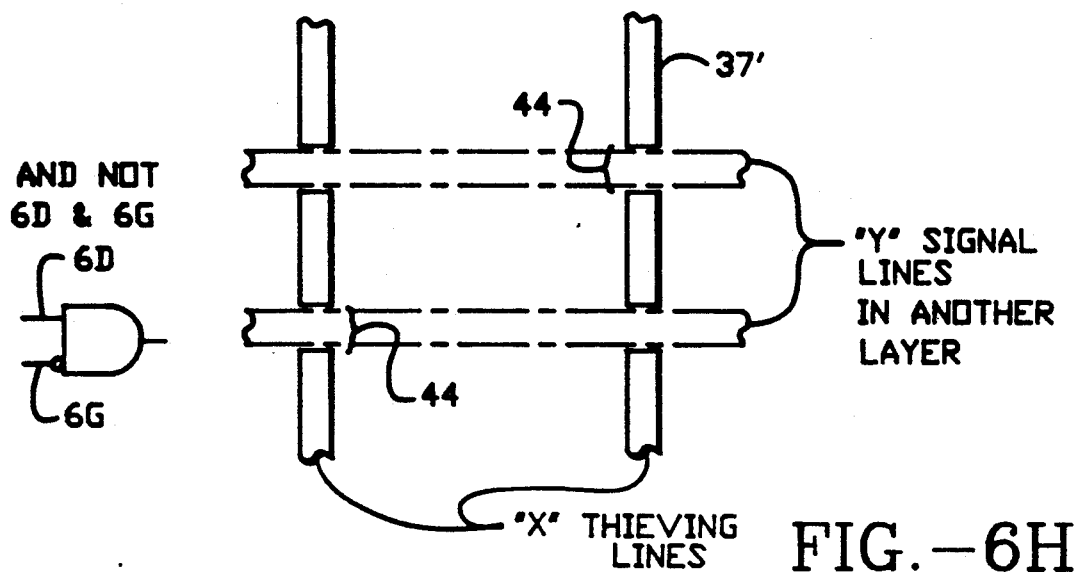
AND NOT 6D & 6G
"Y" SIGNAL LINES IN ANOTHER LAYER
"X" THIEVING LINES
FIG.—6H

"Y" DUMMY

OVERSIZED "Y"

AND NOT 6H & 6J

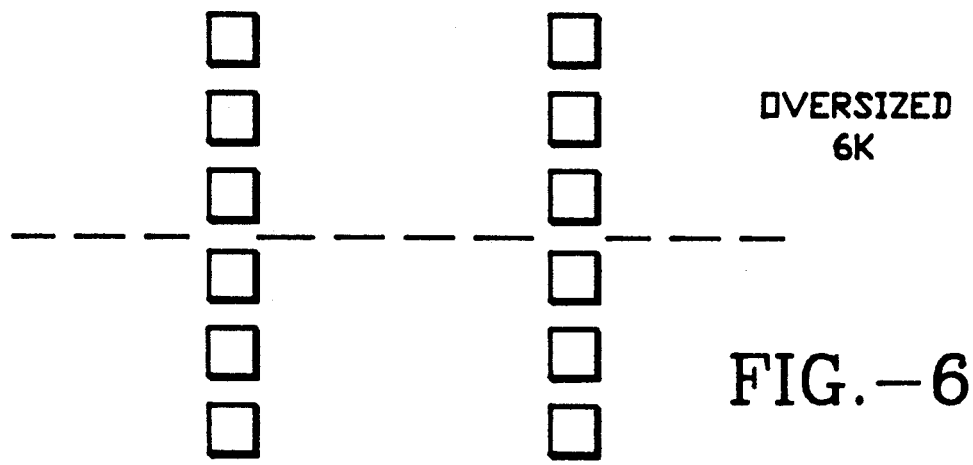
OVERSIZED 6K
FIG.—6L
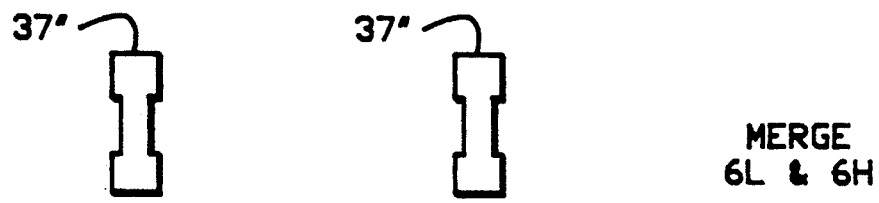
MERGE 6L & 6H
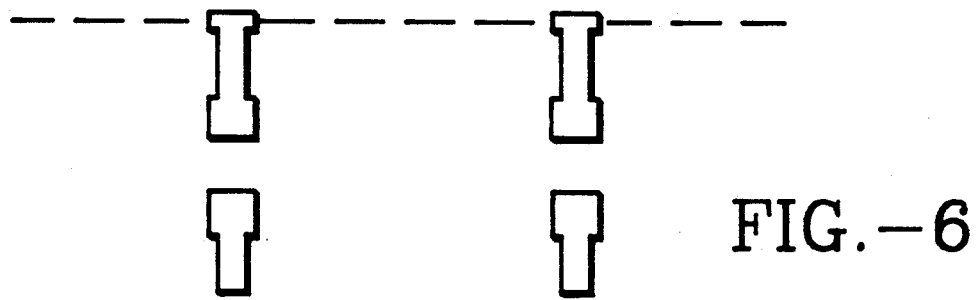
FIG.—6M
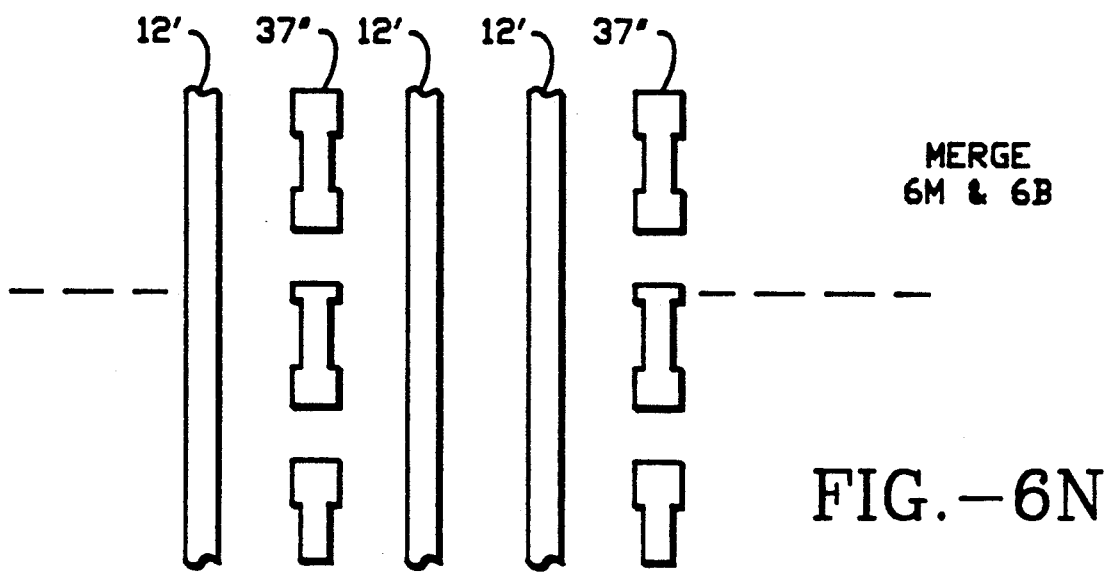
MERGE 6M & 6B
FIG.—6N

HIGH DENSITY ELECTRICAL INTERCONNECTION DEVICE AND METHOD THEREFOR

This is a continuation of application Ser. No. 07/528,880, filed May 29, 1990.

BACKGROUND OF THE INVENTION

The present invention is directed to a high density electrical interconnection device and method therefor and more particularly to an apparatus and method utilizing a thieving pattern.

In the printed circuit board (PCB) industry where the PCB carried electrical conductors (such as copper) to interconnect the various devices, it has been the practice to manually or automatically add large pieces of metal pattern (called "thieving") where the signal conductors were not present. This is intended to make the plating more uniform. In other words, during deposition the distribution of current density and the processing of the electroplating is thus made more uniform.

The foregoing problem is exacerbated or is more critical in a high density electrical connecting structure which is utilized for example to interconnect components (generally integrated circuits or ICs) of high performance digital computers. These structures include multiple layers consisting of conductors disposed in a polymer matrix. Such a high density signal carrier (HDSC) is disclosed in a U.S. application, Ser. No. 055,794, entitled "Method of Forming a Multi-Level Interconnection Device," filed Jun. 1, 1987, in the name of Ho, et al., and assigned to the assignee of the present application.

In addition to the foregoing application, interconnection techniques and structures for interconnecting IC chips on a chip carrier, which includes metallic conductors and polymer materials are also shown in U.S. Pat. No. 4,480,288 to Gazdik, et al., and 4,650,545 to Laakso, et al. In fact, the Gazdik patent discusses a technique for compensating for thermal mismatch between the chip and substrate. This problem is made much more critical in a high density signal carrier structure with which the present invention is especially useful.

OBJECT AND SUMMARY OF INVENTION

It is a general object of the present invention to provide an improved apparatus and method for a high density electrical interconnection device.

In accordance with the above object, there is provided a high density electrical interconnection device which includes a solid insulating substrate into which a plurality of integrated circuits (ICs) are inset or carried thereon, and including a plurality of metallic electrical conductors for connecting said ICs both to each other and to an external connector. The metallic electrical conductors include signal lines. The connections of the ICs to each other and to the external connector are affected by contraction or expansion of said substrate. The electrical device comprises a thieving pattern of conductive lines similar in composition to the signal lines in or on the substrate complementary to said lines, which provides a uniform combined pattern of signal and thieving conductors on the substrate for reducing the contraction or expansion of the substrate and/or improving its uniformity. The thieving lines or conductors are spaced from said signal lines so as not to load them either inductively or capacitively while still providing a uniform combined pattern.

In addition, a method is provided for forming the foregoing.

DETAILED DESCRIPTION OF PREFERRED EMBODIMENT

Figure 1:
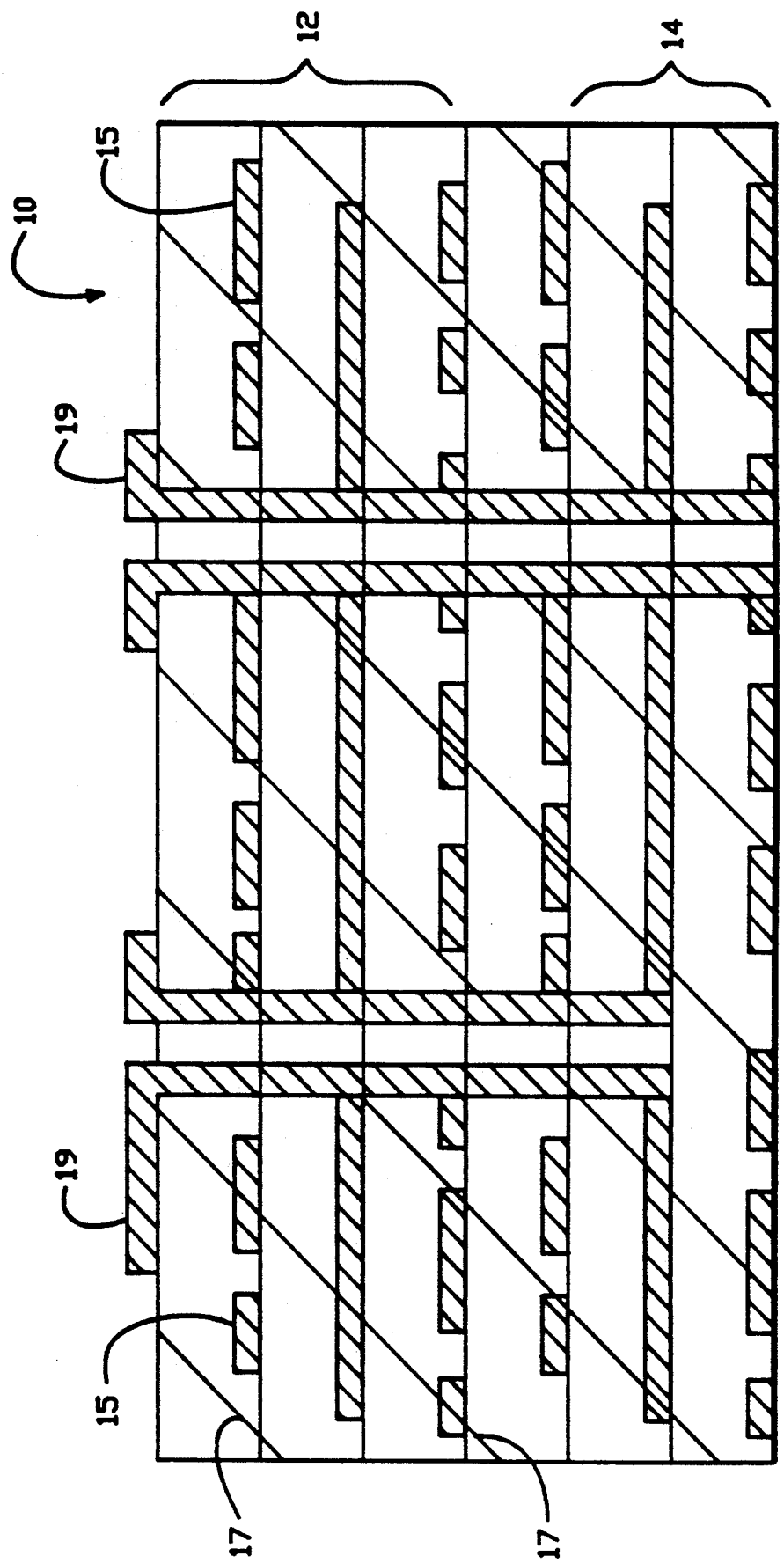
FIG. 1 is a schematic cross-sectional representation of a high density electrical interconnection structure device for which the present invention is especially useful.

FIG. 1 is a high density electrical interconnection device 10 which illustrates the type of high density device for which the present invention is especially useful. It includes a solid insulating substrate 17 of, for example, polyamide material having multiple layers with three layers comprising a signal core 12 and three lower layers a power core 14. Each layer consists of copper strip conductors 15, some of which may lie in an X direction and some a Y direction, as illustrated. In other words, the conductor planes would typically be perpendicular to each other. Interconnecting members 19 are also provided.

The above Ho application discusses in detail the technique of forming such an interconnection device.

Figure 2:
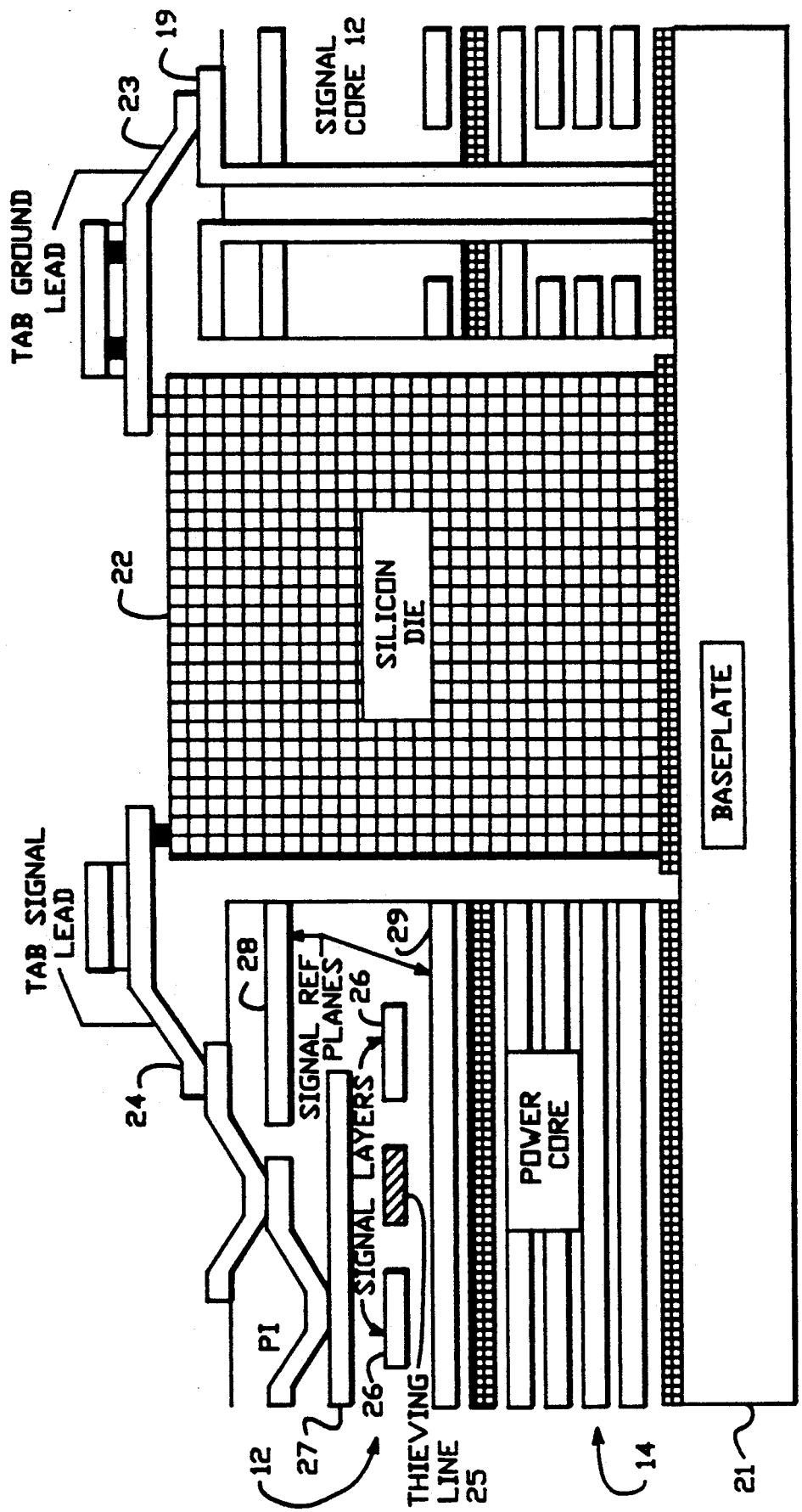
FIG. 2 illustrates a detailed cross-section of an electrical interconnection device illustrating the present invention.

FIG. 2 illustrates (but not to scale) the practical application of such interconnection device of FIG. 1, which includes the signal core 12 and a lower power core 14, all mounted on a base plate 21. Also mounted on the base plate in a cutout of the insulating substrate is a silicon die or integrated circuit 22. The silicon die 22 is connected to the power core via a typical interconnecting member 19 which is designated as a "tab ground lead" 23. The die or integrated circuit 22 is connected to the signal layer via a series of tab signal leads 24.

In accordance with the present invention, in the signal core 12 there are provided several thieving lines (one being shown at 25) which are metallic conductors or lines inserted between signal layers or lines 26 and 27. For example, this thieving line 25 would be complementary to those signal lines 26 laid out in an X orientation to thus comprise an X signal layer. Similarly, a signal line 27 is illustrated which might typically lie in a Y plane or layer. Then, buffering the signal layers are signal reference planes 28 and 29.

Figure 3:
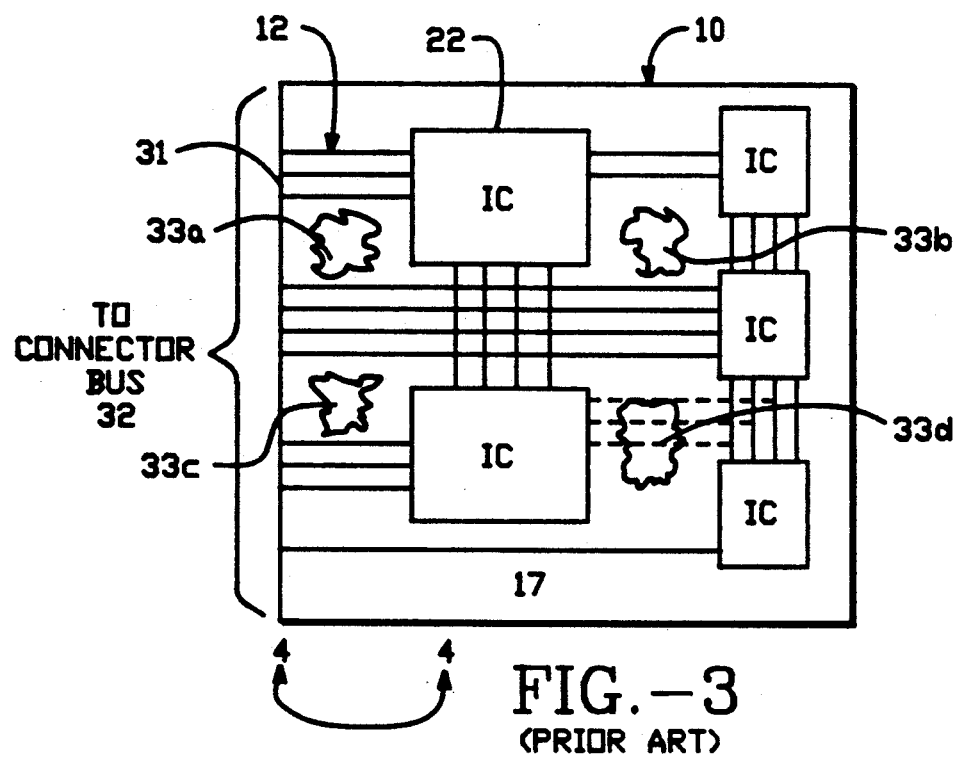
FIG. 3 is a plan view of a high density electrical interconnection device illustrating a prior art technique.

A typical prior art plan view of an interconnection structure (and illustrating the prior art technique of so-called "thieving") is shown in FIG. 3. Here the various integrated circuits or silicon dies 22 are inset into the polyamide or insulating substrate 17 and the various interconnecting signal lines 12 are illustrated. These both interconnect the ICs and go to one edge of the interconnection device shown at 31, which electrically connects to several terminals on a connector bus 32 (not shown).

Also shown in FIG. 3 as a prior art technique are large pieces of copper metal 33a–33d which are either manually or automatically placed on the substrate 17 to provide a somewhat uniform distribution of copper on the substrate. The reason for this, as discussed above, is for uniform deposition of copper during the plating process. This is intended to allow for at least the signal lines to be deposited with a thickness to provide an equal and consistent electrical resistance.

The difficulty with the foregoing is that these large areas of copper sometimes caused signal interference with signal lines in another layer, for example, indicated by the dashed lines at 34; in addition, due to inductive and capacitive effects signal lines in the same layer might be unequally loaded.

Figure 4:
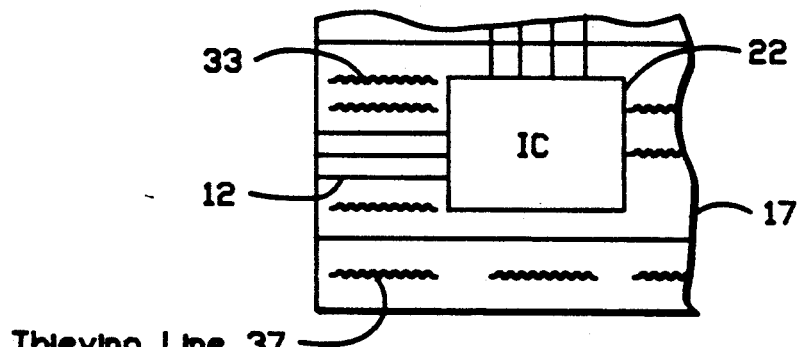
FIG. 4 is a detailed view taken along the line 4—4 of FIG. 3 but incorporating the present invention.

FIG. 4 illustrates the technique of the present invention where complementary thieving lines 37 are placed on or in the substrate 17 (as further indicated by the undulated or weaving character of the lines) to in effect provide a uniform combined pattern of thieving lines 37 and signal lines 12. In addition to providing uniform distribution of copper, it has been discovered that this also improves the uniformity of the mechanical characteristics of the substrate 17 so that localized areas of contraction or expansion which are different from the remaining areas will be eliminated. In addition, it has been found that with the technique of the present invention the overall contraction or expansion due to heat changes is reduced. This allows the entire circuit to be designed with tighter tolerances as well as enhancing yield. For example, implementation of the present thieving pattern has been found to reduce so-called "run-in/run-out" from 5 to 7 mils to less than 2 mils. In addition, non-uniformities in the above run-in/run-out are also reduced. From a plating standpoint uniformity of metal lines was enhanced by 20%.

Finally, as will be discussed below, the providing of gaps (see FIG. 6H and gaps 44) in thieving lines in one layer prevents inductive or capacitive coupling with a signal line in another layer.

Figure 5:
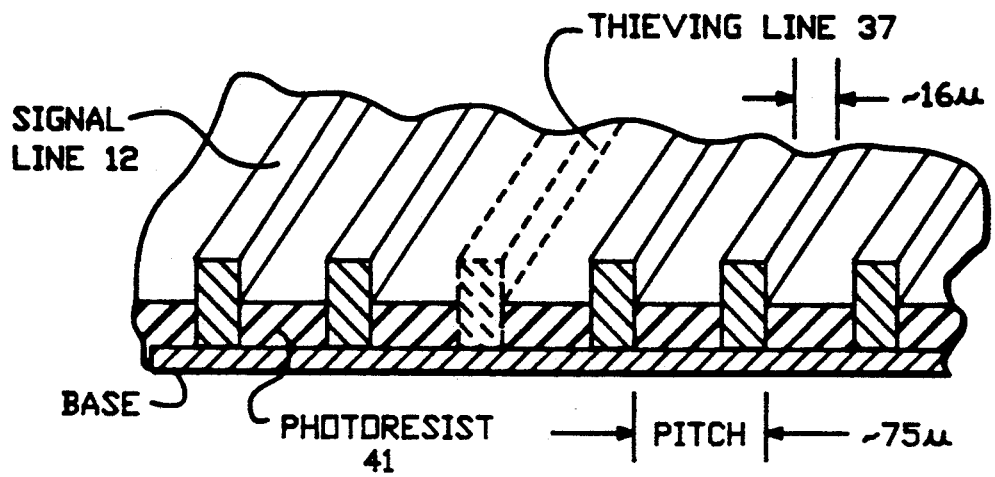
FIG. 5 is a perspective view in simplified form of a portion of FIG. 4.

FIG. 5 illustrates the insertion of a typical complementary thieving line 37 in the otherwise uniform pattern of signal lines 12. Such signal lines are shown as having a relatively constant pitch or spacing from one another, except for the gap into which the thieving line 37 is placed. A typical minimum pitch for signal lines is illustrated as 75 microns with the thickness of both signal and thieving lines being 16 microns. The thieving lines are actually plated (or fabricated) on the substrate at the same time as the thieving lines; this is accomplished in a standard manner, as described in the above Ho application, by computer-aided design (CAD) methods generating an optical pattern which then, by the use or the photoresist 41 produces the signal layer shown in FIG. 5.

Referring briefly back to FIG. 4, although thieving lines 37 have only been shown for one layer, they would normally be installed in all relevant signal layers of the interconnection device. Also, it has been found in actual practice that the thieving lines, as well as being electrically floating, are broken into 1.5 cm segments or smaller. However, this is not believed to be critical; rather, it is an arbitrary distance.

FIGS. 6A through 6N illustrate the process of the present invention. As mentioned above, this process is described only in conjunction with creating the computer-aided design tooling, which is in the form of a glass master with the pattern placed on it, for a single layer. However, it would be repeated in kind for other signal layers.

FIGS. 6A through 6E, however, represent the bare essentials of the process. In FIG. 6A there is shown a dummy layer with a uniform pattern of parallel conductive thieving lines similar in orientation, for example, the X direction to the lines of the particular signal layer of the interconnection device which is shown in FIG. 6B. As discussed in conjunction with FIG. 5, it is assumed that the signal lines are laid out with a uniform or minimum pitch and thus, the dummy layer of thieving lines is provided with the same pitch. And, as discussed above, the same process to be discussed below would apply to a perpendicular or Y layer.

In the step illustrated in FIG. 6C, the signal layer of FIG. 6B is oversized by an amount equivalent to the minimum space or pitch desired between the signal and the thieving lines. And this distance X is typically the pitch or twice the pitch (as used in the preferred embodiment to clearly avoid inductive coupling). In any case, the object is to provide first, a uniform pattern so that the expansion and contraction is uniform; secondly, to provide for uniformity of electroplating of the conductive lines; and then, to maintain a distance to avoid inductive coupling. Since all of the foregoing is done on a computer-aided or automated design basis with the ultimate generation of a glass optical mask, the thieving lines of FIG. 6A are designated 37' and the signal lines of FIG. 6B 12'.

Next, in the step illustrated in FIG. 6D, the dummy layer of FIG. 6A is logically combined in an AND NOT function with the oversized signal layer of FIG. 6C to form Fig. 6D. The AND NOT function is also illustrated in FIG. 6D. This creates a theoretical pattern of "X" thieving lines properly spaced from the actual signal lines and will create a uniform overall pattern. In fact, in the final step shown in FIG. 6E the patterns of FIGS. 6B and 6D, that is the signal and the thieving line patterns are merged (an OR function) to provide the final computer-aided design (CAD) pattern of FIG. 6E. It is obvious from this pattern that from a strip line standpoint a uniform pattern has been provided. In a single layer structure or in fact in a simpler type printed circuit board, the foregoing may provide all the advantages of the present invention.

Figure 6H:
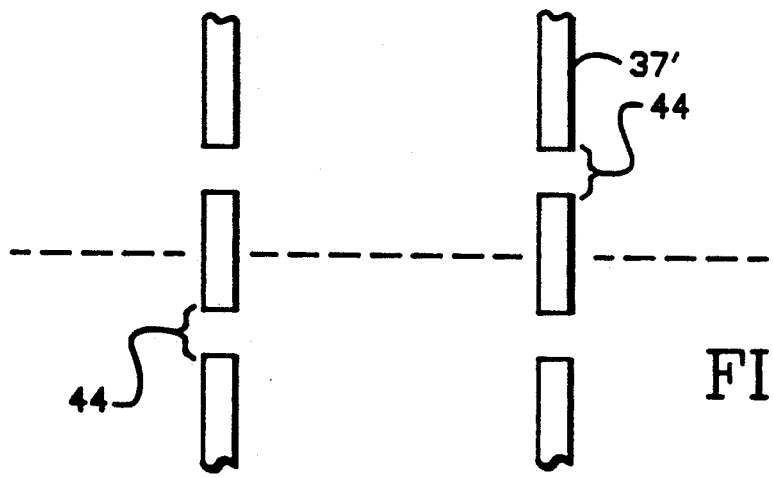
FIGS. 6A through 6N illustrate the method of the present invention.

However, as illustrated in FIGS. 6F, G and H, where there is in fact an additional layer or layers of signal lines, gaps 44 (see FIG. 6H) should be provided in the thieving lines of one layer so as not to cross over another layer's signal lines and thus unduly load it. Thus, as illustrated in FIG. 6D' (which is a redrawn FIG. 6D), eliminating three of the thieving lines for simplicity to provide such gaps in FIG. 6F, a pattern of Y signal lines is generated. Then, this is oversized, as illustrated in FIG. 6G, to an amount equivalent so that the minimum gap 44 is provided. In other words, a gap that will eliminate any undesired capacitive or inductive coupling. Then, as finally illustrated in FIG. 6H, a logical AND NOT operation is carried out with FIGS. 6D and 6G to create the thieving lines 37' having gaps for example illustrated at 44, where the Y signal lines (shown in phantom) would theoretically underlie such gaps.

Yet another concept of the present invention is described in FIGS. 6I through N where undulations or linked alternating broad and narrow sections of thieving lines are provided so that the thieving lines may be visually identified to differentiate them from signal lines. The reason for this is during visual inspection for fatal defect identification these thieving lines can be ignored.

Figure 6I:
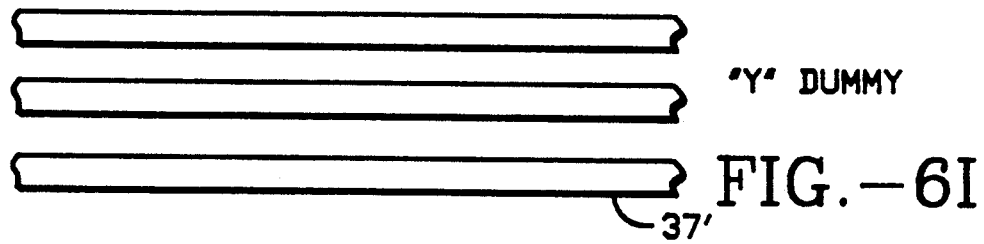
Figure 6J:
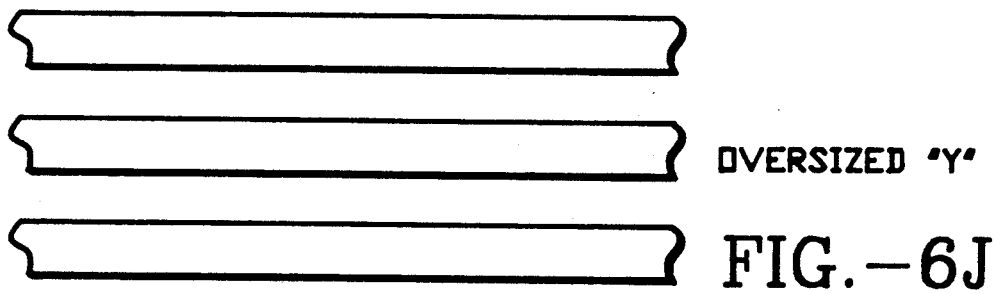
Figure 6K:
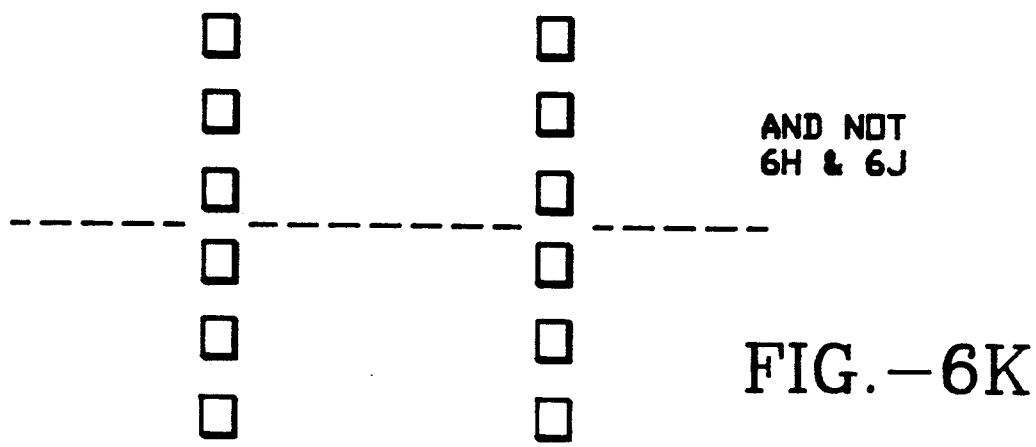

The FIG. 6H is again repeated with the gaps 44 therein. Of the thieving lines 37' only two are shown for simplicity. Specifically, the process for producing the undulations first utilizes, as illustrated in FIG. 6I, a Y dummy uniform layer of thieving lines at a uniform pitch. These are oversized, as illustrated in FIG. 6J, to an amount equivalent such that the line width and spaces are equal. Then, in FIG. 6K, FIGS. 6H and 6J are logically AND NOTed. In other words the oversized Y perpendicular dummy layer of thieving lines is logically combined with the final X thieving lines in FIG. 6H. However, FIG. 6K is representational only and not accurate as far as dimensions.

Then, in order to provide the broad or wide portion of the undulation, FIG. 6K, as illustrated in FIG. 6L, is oversized by the amount of broadening. In essence, this is the amount equivalent to the actual broad sections of the undulations. The final undulating thieving lines designated 37" are shown in FIG. 6M, which is the result of FIGS. 6L and 6H.

Finally in FIG. 6N a merger is made of the above FIG. 6M with the original thieving pattern of FIG. 6B to provide the final computer-aided design layer which will generate the glass master tooling. It is to be noted that this is somewhat similar to FIG. 6E but with the added concepts of the gaps to eliminate crossover coupling and also the visual identification of the thieving lines with undulations.

Thus, a uniform line patterning has been provided without inducing additional loading on the signal layers of, for example, an XY signal pair in a strip line cross-section. As discussed above, in addition to providing more uniform plating of the conductive lines, run-in/run-out has both been made uniform and reduced over all. This helps make manufacturing to design tolerances possible as well as enhancing the yield for cost savings.

We claim:

1. A high density electrical interconnection device which includes a solid insulating substrate into which a plurality of integrated circuits (ICs) are inset or carried thereon, and including a plurality of metallic electrical conductors plated on said substrate for connecting said ICs both to each other and to an external connector, said metallic electrical conductors including signal lines arranged substantially parallel to each other but with non-uniform spacing, said connections of said ICs to each other and to said external connector being affected by contraction or expansion of said substrate, said electrical device comprising:

a thieving pattern of conductive lines similar in composition to said signal lines in or on said substrate, and complementary to said signal lines, and placed between said non-uniformly spaced signal lines to provide a uniform combined pattern of signal and thieving conductors on said substrate for reducing said contraction or expansion of said substrate and improving the uniformity of the plating of said signal line conductors, said thieving lines being spaced from said signal lines so as not to load them either inductively or capacitively while still providing a said uniform, combined pattern and said thieving lines are electrically floating.

2. An interconnection device as in claim 1 wherein said thieving lines are provided with a visual pattern different from said signal lines.

3. An interconnection device as in claim 2 where said pattern is undulations in the thieving line.

4. An interconnection device as in claim 1 having a plurality of stacked layers, each layer including both said thieving and signal lines and where said thieving lines of one layer include gaps where said thieving lines may pass over a signal line in another layer.

5. An interconnection device as in claim 1 having a plurality of stacked layers each including both said thieving and signal lines.

* * * * *